(12) United States Patent
Kim et al.

(10) Patent No.: US 9,585,273 B2
(45) Date of Patent: Feb. 28, 2017

(54) WINDOW MEMBER AND METHOD OF MANUFACTURING THE SAME

(71) Applicant: Samsung Electronics Co., Ltd., Gyeonggi-do (KR)

(72) Inventors: Myung-Gon Kim, Gyeonggi-do (KR); Soon-Ho Han, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 302 days.

(21) Appl. No.: 14/192,367

(22) Filed: Feb. 27, 2014

(65) Prior Publication Data

US 2014/0268590 A1 Sep. 18, 2014

(30) Foreign Application Priority Data

Mar. 12, 2013 (KR) ........................ 10-2013-0026067

(51) Int. Cl.
*H05K 5/00* (2006.01)
*H05K 5/03* (2006.01)
*B05D 3/06* (2006.01)
*B05D 3/12* (2006.01)
*H04M 1/02* (2006.01)
*G06F 1/16* (2006.01)
(Continued)

(52) U.S. Cl.
CPC .............. *H05K 5/03* (2013.01); *B05D 3/067* (2013.01); *B05D 3/12* (2013.01); *H04M 1/0283* (2013.01); *H05K 5/0017* (2013.01); *G06F 1/1601* (2013.01); *H04M 1/0266* (2013.01); *H05K 9/0073* (2013.01); *H05K 9/0088* (2013.01)

(58) Field of Classification Search
CPC .. G06F 1/1601; H05K 9/0073; H05K 9/0088; B32B 17/00; B32B 37/00; G02F 2202/28; G02B 1/18; G02B 1/14; C09J 2203/318; C09J 2400/16; C09J 7/0292
USPC ..... 345/173; 156/60; 427/510; 428/1.5, 344; 361/679.21
See application file for complete search history.

(56) References Cited

U.S. PATENT DOCUMENTS

2008/0124494 A1* 5/2008 Husemann ............. C09J 7/0246
428/1.5
2011/0033720 A1 2/2011 Fujita et al.
2011/0109564 A1 5/2011 Lee et al.
(Continued)

FOREIGN PATENT DOCUMENTS

EP 2 066 162 A1 6/2009
EP 2 727 889 A1 5/2014
(Continued)

*Primary Examiner* — Binh Tran
(74) *Attorney, Agent, or Firm* — Cha & Reiter, LLC

(57) ABSTRACT

A window member includes: a glass member; a display member wherein the glass member has a bottom surface which faces and overlays the display member and a pattern layer provided on a first surface of the glass member and having a fine pattern. The pattern layer is silk-screen printed on the first surface of the glass member to directly contact the surface of the glass member. A method of manufacturing a window member, includes: forming a pattern layer such that the pattern layer contacts a surface of the glass member along a periphery of the glass member. The pattern layer is formed at a location which is offset inward from a periphery of the glass member.

14 Claims, 4 Drawing Sheets

(51) Int. Cl.
   *H05K 7/00*    (2006.01)
   *H05K 9/00*    (2006.01)

(56) References Cited

U.S. PATENT DOCUMENTS

2014/0342121 A1* 11/2014 Taguchi .................. G02B 1/105
                                                      428/141

FOREIGN PATENT DOCUMENTS

| JP | 2004-163482 A | 6/2004 |
| KR | 10-2008-0084544 A | 9/2008 |
| KR | 10-2009-0030932 A | 3/2009 |
| KR | 10-2011-0002857 A | 1/2011 |
| KR | 10-2012-0079190 A | 7/2012 |

* cited by examiner

WINDOW MEMBER AND METHOD OF MANUFACTURING THE SAME

CROSS REFERENCE TO RELATED APPLICATION

This application claims the priority under 35 U.S.C. §119(a) to Korean Application Serial No. 10-2013-0026067, which was filed in the Korean Intellectual Property Office on Mar. 12, 2013, the entire content of which is hereby incorporated by reference in its entirety.

TECHNICAL FIELD

The present disclosure relates generally to a window member attached on a display device and a method of manufacturing the same.

BACKGROUND

In general, a display device provided in a portable terminal includes a display module, and a transparent window member mounted on the display module. The window member protects the display module while revealing a screen and images generated by the display module.

As a recent portable terminal including a display device can perform various functions such as access to the Internet and reproduction of a multimedia file, a touch function is mounted and included with the display device. That is, an input device can be realized and provided through a display device to which a touch function is mounted and included instead of providing a separate input device. Utilizing a screen display area for providing both access to the Internet and a providing multimedia functions such as touch capability for providing input functions portability of the portable terminal is enhanced. Accordingly, portability of a portable terminal can be maintained while also providing a large-sized display device mounted to the portable terminal.

As mentioned above, the display device includes a window member to reveal a screen for viewing and protect a display module. Almost the whole area of the window member is preferably transparent to reveal and transmit a screen displayed in the display module, but a bonding member such as a double-sided tape is disposed at least at a periphery of the window member to mount the window member to a housing of the portable terminal. It is apparent that a portion of the housing directly supporting a periphery of the window member or the bonding member is exposed to the outside through the transparent window member. An internal structure or the bonding member of the housing can be concealed by printing or making the periphery of the window member opaque.

FIG. 1A is a sectional view showing a window member of a general portable terminal, and FIG. 1B is a view showing that a film layer including a pattern layer is coupled to a glass member. Referring to FIGS. 1A and 1B, the window member 10 includes a glass member 11 such as tempered glass, a film layer 12, a pattern layer 13 formed along a periphery of the glass layer 11, a deposition layer 14 formed on one surface of the pattern layer 13, and print layers 15 formed on one surface of the deposition layer 14. The print layers 15 are adapted to conceal a configuration for supporting the window member 10 in a housing of the portable terminal, and are formed of a colored pigment. The pattern layer 13 is formed with a fine pattern such as hair lines along a periphery of the tempered glass. The pattern layer 13 provides a pattern feeling to realize a metallic feeling and appearance at a periphery of the window member 10. The pattern layer 13 is formed by using an ultraviolet curing resin, and the film layer 12 is necessary between the glass member 11 and the pattern layer 13 to attach the ultraviolet curing resin to the glass member 11. The film layer 12 includes a film 12a, and an optically transparent double-sided tape 12b bonding the film 12a to the glass member 11. The pattern layer 13 is formed at a periphery of the film 12a first to provide the pattern layer 13 to the periphery of the glass member 11. The optically transparent double-sided tape 12b is attached to a rear surface of the film 12a having the pattern layer 13, and the film 12a having the pattern layer 13 is combined with the glass member to finish the window member 10.

However, the film layer 12 is necessary only to form the pattern layer 13, but does not contribute to the window member 10, and thus to the function and structure of the portable terminal. Further, since the film layer 12 increases an entire thickness of the window member 10 and a manufacturing process of attaching the film layer 12 to the glass member 11, the manufacturing process is complex and processing costs also increase accordingly.

SUMMARY

Accordingly, an aspect of the present invention is to provide a window member of a portable terminal in which a pattern layer formed at a periphery of the window member can directly contact a glass member, and a method of manufacturing the same.

Another aspect of the present invention is to provide a window member of a portable terminal which can increase both a fineness and a precision of a pattern provided in a pattern layer and diversify an outer design of the portable terminal.

In accordance with another aspect of the present invention, there is provided a window member including: a glass member; a display member wherein the glass member has a bottom surface which faces and overlays the display member, and a pattern layer provided on a first surface of the glass member and having a fine pattern, wherein the pattern layer is silk-screen printed on the first surface of the glass member to directly contact the surface of the glass member.

In accordance with another aspect of the present invention, there is provided A window member including: a glass member; a display member wherein the glass member has a bottom surface which faces and overlays the display member, a pattern layer silk-screen printed on one surface of the glass member by using a transparent ultraviolet curing resin and having a fine pattern; the fine pattern having elements positioned in a predetermined arrangement; a deposition layer deposited in an interconnected design on the pattern layer; and one or more print layers provided in the deposition layer, wherein the pattern layer directly contacts a surface of the glass member and is formed to have an offset position with respect to a periphery of the glass member, wherein the pattern layer is silk-screen printed on the first surface of the glass member to directly contact the surface of the glass member.

In accordance with another aspect of the present invention, there is provided a method of manufacturing a window member, the method including: forming a pattern layer such that the pattern layer contacts a surface of the glass member along a periphery of the glass member, wherein the pattern layer is formed at an offset position with respect to the glass surface, wherein the offset is arranged inward from a periphery of the glass member by a predetermined distance.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION

Figure 1A:
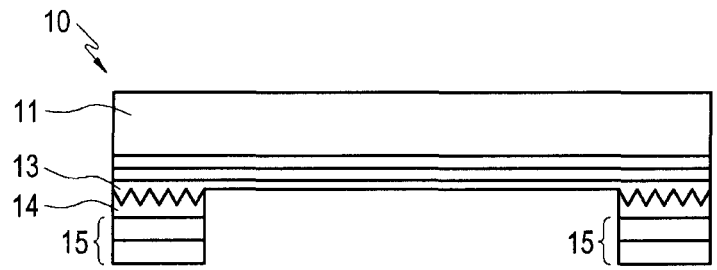
FIG. 1A is a sectional view showing a window member of a general portable terminal according to the prior art.
Figure 1B:
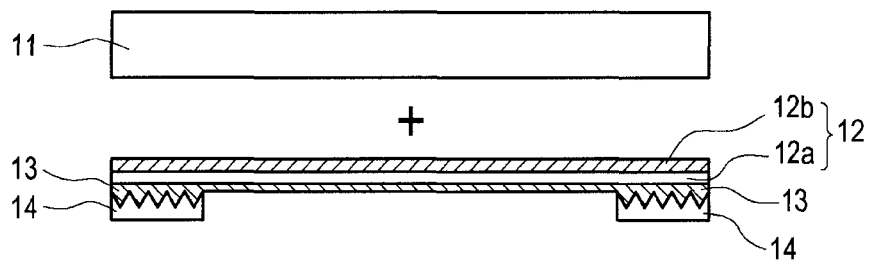
FIG. 1B is a view showing that a film layer including a pattern layer is coupled to a glass member for a window member according to the prior art.

Hereinafter, window members and a method of manufacturing the same according to various embodiments of the present invention will be described with reference to the accompanying drawings to assist in a comprehensive understanding of exemplary embodiments of the invention as defined by the claims and their equivalents. In the process, thicknesses of lines shown in the drawings and sizes of constituent elements may be exaggerated for clarity and convenience. In the following description, detailed descriptions of well-known functions or configurations will be omitted since they would unnecessarily obscure the subject matters of the present invention by a person of ordinary skill in the art with unnecessary detail of the well-known functions and structures. Also, the terms used herein are defined according to the functions of the present invention. Thus, the terms may vary depending on users' or operators' intentions or practices. Therefore, the terms used herein should be understood based on the descriptions made herein in view of the ordinary level of skill in the art. The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

Further, the following terms are defined considering their functions in the present invention and may be varied according to intentions and customs of a user or manager. Thus, the terms should be defined based on the contents of the entire specification. Further, although ordinal numbers such as first and second are used in the description of the embodiments of the present invention, their sequence may be arbitrarily determined and the description of the preceding elements may be applied in the description of the succeeding elements.

The window member according to the embodiment of the present invention, which will be described below, is located on a front surface of a display module to protect the display module, and in particular, has a feature in a lamination structure of a peripheral portion of the display module except for a portion through which a screen transmits. Hereinafter, the window member and the method of manufacturing the same according to the embodiments of the present invention will be described in detail with reference to FIGS. 2 to 7.

Figure 2:
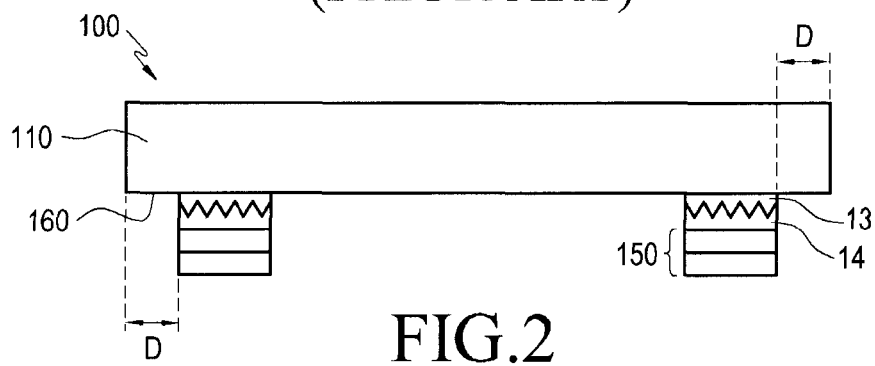
FIG. 2 is a sectional view showing a configuration of a window member according to an embodiment of the present invention.
Figure 3:
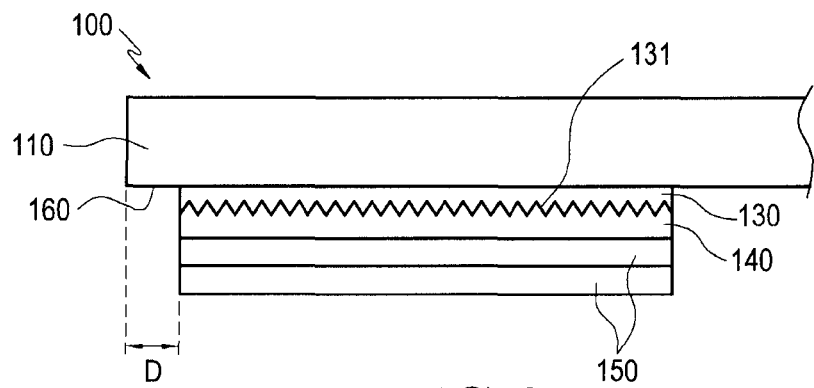
FIG. 3 is a partially enlarged sectional view showing one side of a window member.

FIG. 2 is a sectional view showing a configuration of a window member according to an embodiment of the present invention, and FIG. 3 is a partially enlarged sectional view showing one side of the window member of FIG. 2. As shown in FIGS. 2 and 3, the window member 100 provided in the portable terminal according to the embodiment of the present invention has a configuration in which a pattern layer 130, a deposition layer 140, and print layers 150 are sequentially laminated under a glass member 110 while the glass member 110 acts as an uppermost layer. Then, the pattern layer 130 directly contacts a surface corresponding to a rear surface of the glass member 110, and a detailed description thereof will be described below.

The glass member, in particular, the glass member 110 provided in the window member 100 for a portable terminal is obtained by tempered glass. Since the glass member 110 such as tempered glass has an excellent transmittance and an excellent surface hardness and has an advantage in touch reaction, it is usefully utilized as a window member 100 of a portable terminal. In addition, considering the vulnerability of the glass member 110, a protection film is attached to the glass member 110 or the glass member 110 is coated to disperse or alleviate an impact.

When the window member 100 is mounted and coupled to a housing of the portable terminal, a periphery of the glass member 110 is attached to the housing of the portable terminal. That is, the window member 100 is fixed to the housing of the portable terminal, more specifically, a bezel area (in the embodiment, the bezel refers to a periphery of the transparent glass member 110 except for a portion transmitting a screen) located at a periphery of the glass member 110, more specifically, a periphery of the display device. Since the pattern layer 130, the deposition layer 140, and the print layers 150 are formed at the bezel portion of the window member 100 to shield the bonding member such that the bonding member is not exposed to a surface of the window member 100 while realizing a metallic appearance and feeling, to provide a luxuriousness and quality appearance to the bezel area.

The pattern layer 130 is formed along a periphery of a rear surface of the glass member 110, and directly contacts the rear surface of the glass member 110. In order to bring the pattern layer 130 into contact with the rear surface of the glass member 110, an ultraviolet curing resin 250 (see FIG. 5) is silk-screen printed on the rear surface of the glass member 110. The pattern layer 130 is a configuration for realizing a design or a pattern in the deposition layer or the print layers 150, which will be described below, and is formed of a transparent ultraviolet curing resin 250 to express only the design while transmitting a color feeling and appearance of the deposition layer 140 or the print layers 150. However, the material of the pattern layer 130 is not limited thereto, and any material which can be formed to directly contact the rear surface of the glass member 110 may be used as the material of the pattern layer 130. In a detailed description of silk-screen printing of the ultraviolet curing resin 250 in the glass member 110 (see FIG. 5), a jig 300 is fixed to the glass member 110. A silk-screen printing apparatus 200 is provided on one surface of the glass member 110 fixed to the jig 300, and the ultraviolet curing resin 250 is provided on an upper surface of the silk screen 210. A squeegee 220 is moved on the upper surface of the silk screen 210 while pushing the ultraviolet curing resin 250. The ultraviolet curing resin 250 is printed from the silk screen 210 to the glass member 110 to form a pre-pattern layer 120 according to driving of the squeegee 220 across the silk screen 210. The pre-pattern layer 120 corresponds to a state before formation of a fine pattern 131, and may be partially cured if necessary before the fine pattern 131 is formed. The fine pattern 131 is formed by attaching and pressing a transfer film 400 having a pattern of a desired shape to the pre-pattern layer 120 while the transfer film 400 faces the pre-pattern layer 120. The transfer film 400 may be attached and pressed to the pre-pattern layer 120 by using a mold or a roller.

Accordingly, the fine patterns 131 in the form such as hair lines, grids, or polygonal shapes or other graphical or texture elements which are formed regularly or irregularly on one surface of the pattern layer 130. The form of the fine pattern 131 is not limited to the above-described forms but may be variously modified to designs such as symbolic letters, figures, or logos of companies or other graphical elements. As described above, if the ultraviolet curing resin 250 is silk-screen printed on the glass member 110, a resin layer (corresponding to the above-described pre-pattern layer) is formed on a surface of the glass member and the fine pattern 131 is formed on a surface of the resin layer by using the transfer film 400.

Figure 4:
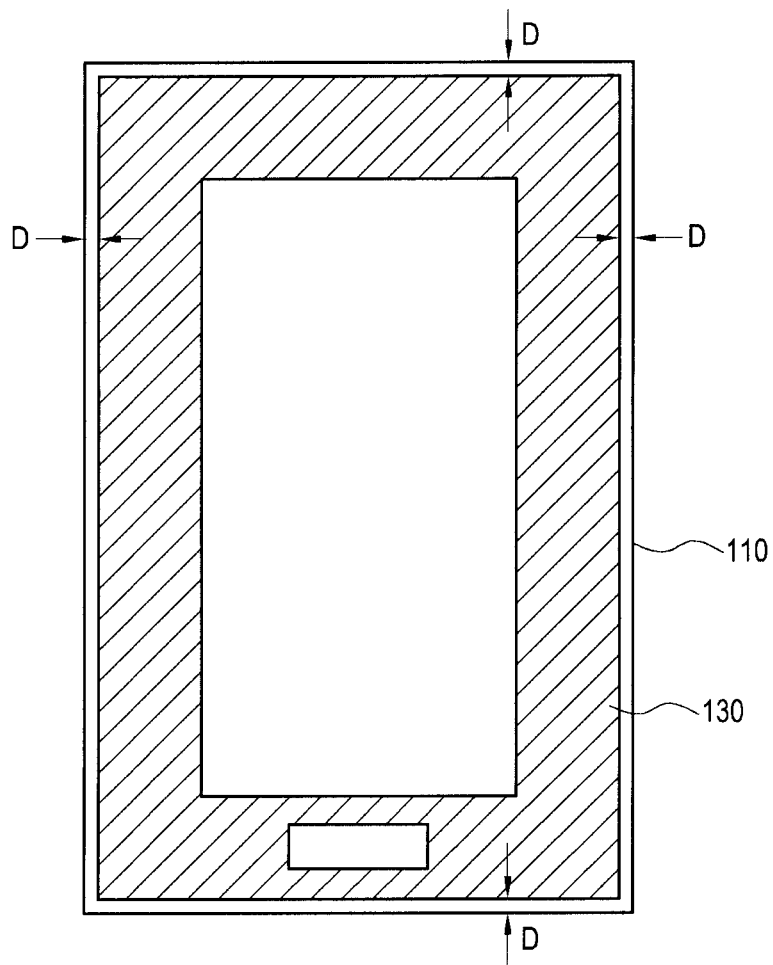
FIG. 4 is a plan view showing a pattern layer formed in a glass member of a window member to have an offset.

FIG. 4 is a plan view showing a pattern layer formed in a glass member of the window member of FIG. 2 to have an offset away from the edge of the glass member 110. As shown in FIG. 4, the pattern layer 130 is spaced inward apart from a periphery of the glass member 110 to have an offset. The reason why the offset 160 is formed is because the ultraviolet curing resin 250 can be prevented from overflowing from a periphery of the glass member 110 when it is silk-screen printed on the rear surface of the glass member 110, and a degree by which the ultraviolet curing resin 250 is pushed toward the outside of the glass member 110 can be considered when the transfer film 400 is pressed in the process of forming the fine pattern 131 in the partially cured pattern layer 130 (see FIGS. 5 and 6 together). In the case of a display device provided in a portable terminal, the offset 160 may have a length D of less than 0.5 mm, and more preferably, has a length D of about 0.3 mm. However, the length D of the offset 160 is a length based on a recent portable terminal, and may be various modified according to a device to which the window member 100 is provided.

As described above, the fine patterns 131 having various forms are formed on one surface of the pattern layer 130 which the deposition layer 140 contacts. The fine patterns 131 are formed to have an interval of less than 50 μm (0.05 mm). Accordingly, a periphery of the window member 100, that is, the bezel area can realize a luxurious outer shape and appearance.

Meanwhile, it has been described above that the ultraviolet curing resin 250 silk-screen printed to form the fine pattern 131 is not completely cured but partially cured. Here, the ultraviolet curing resin 250 is partially cured not by completely curing the ultraviolet curing resin 250 but by irradiating light corresponding to one third or one fourth of an amount of light necessary for complete curing, thus to cure the ultraviolet curing resin 250 by a degree to which only the form of the ultraviolet curing resin 250 can be changed. The ultraviolet curing resin 250 is completely cured by irradiating light of 200 nM to 400 nM. As described above, the fine pattern 131 is formed by attaching and pressing the transfer film 400 having a pattern of a shape corresponding to the fine pattern 131 to the surface of the partially cured ultraviolet curing resin 250 while the transfer film 400 faces the surface of the partially cured ultraviolet curing resin 250. In that way, the fine pattern is transferred to the partially cured ultraviolet curing resin. If the partially cured ultraviolet resin layer 250 having the fine pattern 131 is completely cured by irradiating light to the partially cured ultraviolet resin layer 250, the pattern layer 130 directly contacts the rear surface of the glass member 110.

Figure 5:
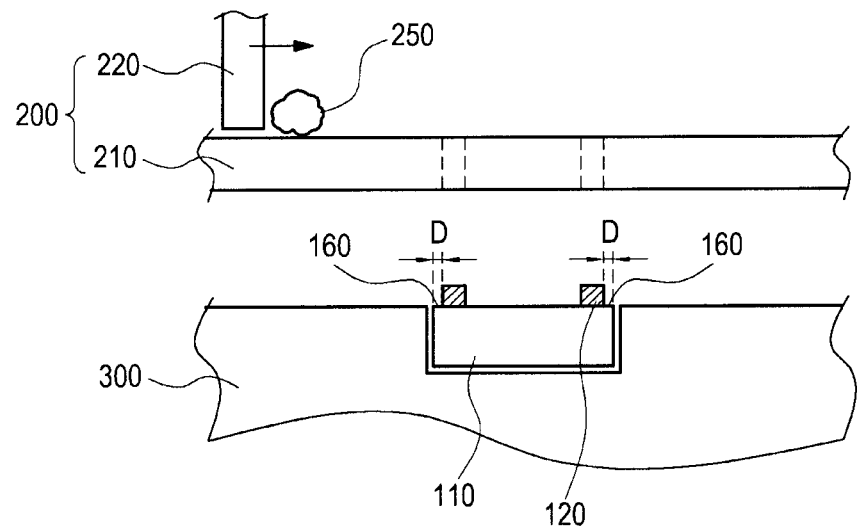
FIG. 5 is a view for explaining a process of forming a pattern layer on one surface of the glass member of the window member.
Figure 6:
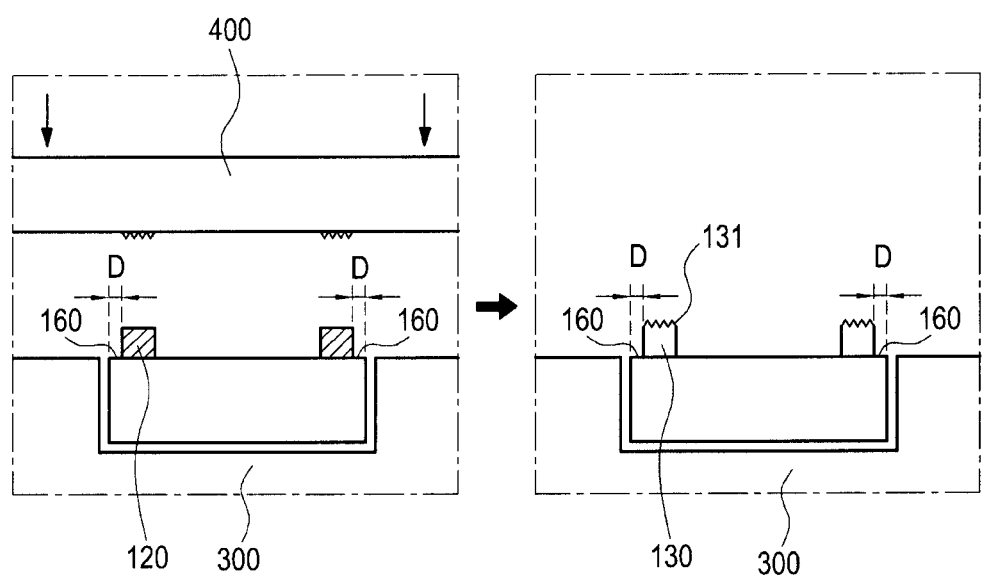
FIG. 6 is a further view for explaining a process of forming a fine pattern.

FIG. 5 is a view for explaining a process of forming a pattern layer on one surface of the glass member of the window member of FIG. 2. FIG. 6 is a view for explaining a process of forming a fine pattern of FIG. 5. Referring to FIGS. 5 and 6, a process of silk-screen printing the above-described ultraviolet curing resin 250 on the glass member 110 and forming the fine pattern 131 will be described in detail. As shown in FIG. 5, a silk-screen printing apparatus 200 is provided on one surface of the glass member 110 fixed to the jig 300, and the ultraviolet curing resin 250 is supplied to an upper surface of the silk screen 210. Then, one glass member 110 may be fixed to the jig 300, but a plurality of glass members 110 may also be disposed within the jig 300. The squeegee 220 is moved on the upper surface of the silk screen 250 while pushing the ultraviolet curing resin 250. The ultraviolet curing resin 250 is printed from the silk screen 210 to a surface of the glass member 110 according to driving of the squeegee 220, which forces the curing resin 250 through the silk screen 250 and directly contacts a periphery of the glass member 110. The ultraviolet curing resin 250, that is, the pre-pattern layer 120 is formed to directly contact a periphery of the glass member 110 and may be partially cured if necessary. For example, light is irradiated to the ultraviolet curing resin 250 spaced apart from the periphery of the glass member 110 by the offset 160 to cure the ultraviolet curing resin 250, and light corresponding to one third to one fourth of an amount of light by which the ultraviolet curing resin 250 is irradiated. That is, the ultraviolet curing resin 250 is partially or preliminarily cured. That is, the partially cured ultraviolet curing resin 250 is cured by a degree by which the form of the ultraviolet curing resin 250 can be changed by a firm pressure applied from the outside. Thereafter, as shown in FIG. 6, the transfer film 400 having a pattern corresponding to the fine pattern 131 is located above the glass member 110 having the partially cured pattern layer 130. Here, the transfer film 400 may be a film of a plastic material such as PET. The transfer film 400 may have flexibility, and the pattern of the transfer film 400 forms the fine pattern 131 on a surface of a member such as the pre-pattern layer 120 as the partially cured ultraviolet curing resin 250 attached to a mold is pressed, or the transfer film 400 is rolled while being attached to face the ultraviolet curing resin 250 or is attached to the rear surface of the silk screen 210 or squeegeed across the silk screen. The transfer film 400 may be arbitrarily replaced in the mold or the silk screen 210 to realize various forms of patterns. That is, different fine patterns may be formed even in the products of the same model.

If the transfer film 400 is pressed toward the partially cured pattern layer 130 through the mold or the roller, the pattern of the transfer film 400 is transferred to a surface of the pre-pattern layer 120 to form the fine pattern 131. Further, the transfer film 400 may be provided in the silk-screen printing apparatus 200 together. That is, if the silk screen 210, including, the transfer film 400 is squeegeed on the pre-pattern layer 120 while the transfer film 400 is attached to the rear surface of the silk screen 210, the silk screen 210, including, the transfer film 400 is attached and pressed to the surface of the pre-pattern layer 130, and accordingly, the pattern of the transfer film 400 is transferred to the surface of the pre-pattern layer 120. Then, if the pre-pattern layer 120 still remains partially cured even after the fine pattern 131 is formed, light should be irradiated again to form the completely cured pattern layer 130.

The deposition layer 140 is provided to the pattern layer 130 to which the fine pattern 131 is transferred. The deposition layer 140 is formed by mixing one or two or more of metal materials such as a metal oxide, more specifically, titanium dioxide ($TiO_2$), silicon dioxide ($SiO_2$), and aluminum oxide ($Al_2O_3$) and depositing the mixture to a surface of the fine pattern 131. The deposited material can reflect light entering the window member 100 to reinforce a gloss effect of the bezel area or provide a ceramic appearance and feeling or a metallic appearance and feeling.

At least one print layer 150 formed of chromatic pigments may be formed on the deposition layer 140. The print layer 150 may be selectively provided according to a design of a portable terminal to which the window member 100 is mounted. That is, a design of the bezel can be realized with a color feeling or appearance of the deposition layer 140 or a shape or arrangement of the fine pattern 131 of the pattern layer 130.

As described above, since the pattern layer 130 is directly formed in the glass member 110 in the case of the window member 100 according to the embodiment of the present invention, a manufacturing process thereof can be simplified and manufacturing costs can be reduced. Further, since various forms of fine patterns 131 may be formed in the partially cured ultraviolet curing resin 250, various visual effects can be realized at a periphery of the window member 100 by applying different pattern layers.

Hereinafter, a method of manufacturing the above-configured window member will be described. Prior to the description of the method, it is understood that the window member used in the method is the above-described and referenced window member and the description of the window member is applied to the description of the method. The reference to the window member will be applied to the method.

Figure 7:
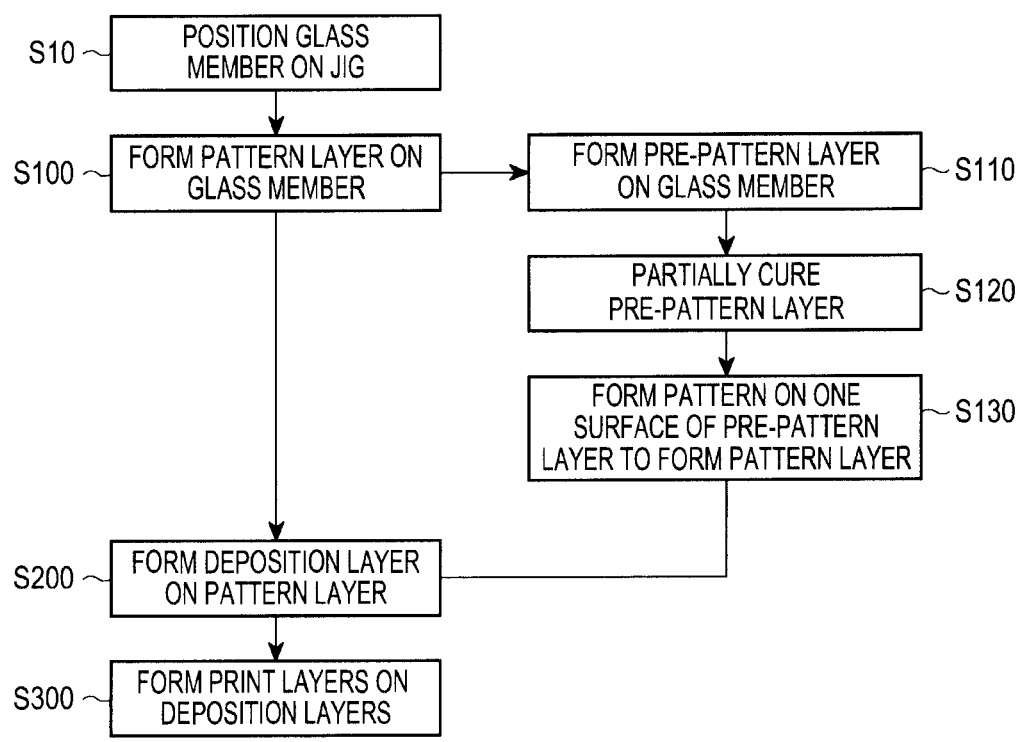
FIG. 7 is a flowchart showing the steps of a method of manufacturing a window member.

FIG. 7 is a flowchart showing a method of manufacturing the window member of FIG. 2. Referring to FIG. 7 and the reference to the window member 100, the glass member 110 such as tempered glass is processed to be installed in the display device of the portable terminal. The processed glass member 110 is fixed to the jig 300 (S10), in which state the pattern layer 130, the deposition layer 140, and the print layers 150 are sequentially laminated (S100 to S300). The method of manufacturing the window member 100 mainly includes a step S100 of forming the pattern layer 130 along a periphery of the glass member 110 such that the pattern layer 130 contacts a surface of the glass member 110, a step S200 of forming the deposition layer 140 on the pattern layer 130, and a step S300 of forming the print layers 150 with the pattern layer 130. In addition, the step of forming the pattern layer 130 includes a step S110 of forming the pre-pattern layer 120 on a surface of the glass member 110, a step S120 of partially curing the pre-pattern layer 120, and a step S130 of forming a fine pattern 131, and a step S130 of completely curing the pre-pattern layer 120 having the fine pattern 131. The pre-pattern layer 120 corresponds to a state in which the ultraviolet curing resin 250 is printed on the glass member 110, and corresponds to a state before the ultraviolet curing resin 250 is not completely cured.

The silk-screen printing apparatus 200 is positioned above the glass member 110 which is positioned on the jig 300. If the squeegee 220 positioned on the silk screen is driven across the silk screen 210, the transparent ultraviolet curing resin 250 supplied to the silk screen already is printed to the periphery of the glass member 110 to form the pre-pattern layer 120 (S110). As described above, when the ultraviolet curing resin 250 is printed in the glass member 110 to form the pre-pattern layer 120, it is printed at a location which is offset (160) inward from the periphery of the glass member 110 (see FIG. 5). The pre-pattern layer 120 spaced apart from the periphery of the glass member 110 and directly formed on a surface of the glass member 110 is partially cured to form the fine pattern 131 (S120). Since the contents related to the partial curing of the pre-pattern layer 120 have been described above, the above-described contents are applied.

The transfer film 400 having a pattern corresponding to the fine pattern 131 is located on the partially cured pre-pattern layer 120. If the transfer film 400 is attached and pressed to the pre-pattern layer 120 by using the mold, the roller or the silk-screen printing apparatus, the fine pattern 131 is formed on a surface of the partially cured pre-pattern layer 120 to form the fine pattern 131 (S130).

In order to form the fine pattern 131, first, the transfer film 400 having a pattern is attached and pressed to the pre-pattern layer 120 by the mold or the roller before the pre-pattern layer is fully cured. As the pattern of the transfer film 400 is transferred to a surface of the pre-pattern layer 120, the fine pattern 131 is formed on a surface of the pre-pattern layer 120. Further, the transfer film 400 may be provided on a rear surface of the silk screen 210 together. Accordingly, after the pre-pattern layer 120 is formed on a surface of the glass member 110 through the silk-screen printing apparatus 200, the silk-screen printing apparatus 200 in which the transfer film 400 is disposed is squeegeed to the partially cured pre-pattern layer 120. Accordingly, the pattern of the transfer film 400 is transferred to the surface of the pre-pattern layer 120 to form the fine pattern 131.

The pre-pattern layer 120 is completely cured after the fine pattern 131 formed on the pre-pattern layer 120 is partially cured. Accordingly, the pattern layer 130 having an offset 160 at a periphery of the glass member 110 and directly formed on a surface of the glass member 110 is finished.

If the pattern layer 130 directly contacting a surface of the glass member 110 is finished, the deposition layer 140 is formed on one surface of the pattern layer 130 (S140). That is, the glass member 110 is disposed in the deposition chamber for metal deposition.

Thereafter, at least one print layer 150 is formed in the deposition layer 140. That is, the print layers 150 are formed by printing an achromatic or chromatic pigment to a surface of the deposition layer 140 and curing the printed pigment. As the print layers 150 having the color is provided, various color appearance can be provided at a periphery of the window member 100.

As described above, as the pattern layer 130 may be directly formed on a surface of the glass member 110, the manufacturing method becomes simple. Further, as the pattern layer 130, the deposition layer 140, and the print layers 150 are formed at a periphery of the glass member 110, the units for bonding the window member 100 can be concealed and an appealing feeling and appearance or a metallic feeling and appearance can be provided through various forms of pattern decorations and colors.

Meanwhile, in the embodiments of the present invention, the pre-pattern layer, more specifically, the pattern layer is preferably formed in the bezel area. However, if the ultraviolet curing resin forming the pattern layer is transparent, the ultraviolet curing resin can be applied to an entire surface of the glass member except for an area which is offset inward from a periphery of the glass member to form a pre-pattern layer or a pattern layer. It is apparent that the fine pattern should be formed only in the bezel area since the remaining areas other than the bezel area should substantially be transparent to transmit a clear view of the underlying screen.

Since the above-described window member is configured such that the pattern layer formed at a periphery of the window member can directly contact the glass member, the window member can be made slim by removing a conventional film layer. Further, by eliminating the processes for attaching the film layer, a window member manufacturing process can be simplified and manufacturing costs can be reduced.

Further, since the pattern layer is formed at a location which is offset inward from a periphery of the glass member by using silk-screen printing, the ultraviolet curing resin can be prevented from overflowing along a side.

Furthermore, since a fineness and a precision of the fine pattern provided in the pattern layer can be increased together, an outer design of the portable terminal can be diversified.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A portable electronic device comprising:
   an external housing comprising a first surface and a second surface oriented in a direction opposite to the first surface;
   a first layer that is formed on at least a part of the first surface or the second surface, is substantially transparent, and forms at least a part of an external surface of the first surface;
   a second layer that includes a material different from that of the first layer and faces the first layer;
   a third layer that includes a material different from materials of the first layer and the second layer, is inserted between the first layer and the second layer, and includes a surface oriented toward the first layer and a surface oriented toward the second layer, the surface of the third layer oriented toward the first layer being in contact with the first layer; and
   a fourth layer that includes a reflective material different from materials of the first layer to the third layer and is inserted between the second layer and the third layer,
   wherein the surface of the third layer oriented toward the second layer includes a repeating pattern of protrusions protruding toward the second layer, and
   wherein the repeating pattern is offset inward from an edge of the first layer.

2. The portable electronic device according to claim 1, wherein the surface of the third layer oriented toward the second layer is in contact with a surface of the fourth layer.

3. The portable electronic device according to claim 2, wherein the fourth layer has another surface in contact with the second layer.

4. The portable electronic device according to claim 1, wherein the repeating pattern directly contacts a surface of the first layer.

5. The portable electronic device according to claim 4, wherein the repeating pattern is offset by 0.5 mm or less from the edge of the first layer.

6. The portable electronic device according to claim 1, wherein the repeating pattern comprises one or more patterns having shapes of a hair line, a grid, and a polygonal shape.

7. The portable electronic device according to claim 1, wherein the repeating pattern comprises protrusions arranged at a regular interval.

8. The portable electronic device according to claim 7, wherein the interval has a size of 50 μm or smaller.

9. The portable electronic device according to claim 1, wherein the first layer comprises a glass plate.

10. The portable electronic device according to claim 1, wherein the second layer comprises an opaque material.

11. The portable electronic device according to claim 10, wherein the second layer comprises a dye or a pigment.

12. The portable electronic device according to claim 10, wherein the second layer comprises at least one printed layer having at least one color.

13. The portable electronic device according to claim 1, wherein the third layer comprises an ultraviolet-curing resin layer.

14. The portable electronic device according to claim 1, wherein the fourth layer comprises a metal or a metal oxide.

* * * * *